United States Patent [19]

Tsunoda

[11] Patent Number: 5,741,530

[45] Date of Patent: Apr. 21, 1998

[54] MOLDING DIE USED FOR SEALING SEMICONDUCTOR CHIPS WITH GOOD PRODUCTIVITY AND LEAD-FRAME USED FOR MOUNTING SEMICONDUCTOR CHIPS

[75] Inventor: Youichi Tsunoda, Tokyo, Japan

[73] Assignee: NEC Corporation, Tokyo, Japan

[21] Appl. No.: 591,361

[22] Filed: Jan. 25, 1996

[30] Foreign Application Priority Data

Jan. 27, 1995 [JP] Japan .................................. 7-31405

[51] Int. Cl.⁶ .......................... B29C 45/02; B29C 45/14; B29C 45/26
[52] U.S. Cl. .......................... 425/116; 425/117; 425/572; 425/588; 264/272.17; 264/328.8
[58] Field of Search .......................... 425/116, 117, 425/129.1, 544, 572, 588, DIG. 228; 264/272.17, 328.8

[56] References Cited

U.S. PATENT DOCUMENTS

| | | | |
|---|---|---|---|
| 5,123,826 | 6/1992 | Baird | 425/544 |
| 5,158,780 | 10/1992 | Schrawen et al. | 425/116 |
| 5,204,122 | 4/1993 | Konishi | 425/116 |
| 5,302,101 | 4/1994 | Nishimura | 425/588 |
| 5,435,953 | 7/1995 | Osada et al. | 264/272.17 |

FOREIGN PATENT DOCUMENTS

| | | | |
|---|---|---|---|
| 57-187945 | 11/1982 | Japan . | |
| 61-276333 | 12/1986 | Japan . | |
| 6-106567 | 4/1994 | Japan | 425/588 |

*Primary Examiner*—Khanh P. Nguyen
*Attorney, Agent, or Firm*—Ostrolenk, Faber, Gerb & Soffen, LLP

[57] ABSTRACT

A molding die has a plurality of cavity groups each occupying four corners of a rectangular area for accommodating semiconductor chips mounted on a lead-frame, pots each occupying a central area of the rectangular area and a plurality of runner groups each having straight runners equal in length and connecting the pot to the cavities in the four corners, and molten resin concurrently reaches the cavities in the four corners so as to produce semiconductor devices without non-filling or partially filling cavity.

1 Claim, 10 Drawing Sheets ns5,741,530

MOLDING DIE USED FOR SEALING SEMICONDUCTOR CHIPS WITH GOOD PRODUCTIVITY AND LEAD-FRAME USED FOR MOUNTING SEMICONDUCTOR CHIPS

FIELD OF THE INVENTION

This invention relates to a molding die used for sealing semiconductor chips in plastic packages and a lead-frame used for the molding process and, more particularly, to a molding die used for sealing semiconductor chips and a lead-frame available for the molding die.

DESCRIPTION OF THE RELATED ART

A typical example of the lead-frame is illustrated in FIG. 1 of the drawings, and reference numeral 1 designates the prior art lead-frame. The prior art lead-frame 1 includes a frame 1a, lead-pad structures 1b arranged in matrix and tie bars 1c connecting the lead-pad structures 1b to the frame 1a. Alignment holes 1d are formed in the frame 1a, and each of the lead-pad structures 1b includes an island and leads. The matrix of the lead-pad structures 1b is offset from the central area of the frame 1a, and a wide vacant area is left on the right side and the lower side as shown. The wide vacant area is assigned to a cull and runners. The cull as will be described in conjunction with the molding stage.

In the prior art assembling process, semiconductor chips (not shown) are mounted on the islands of the respective lead-pad structures 1b, and the leads are connected through conductive wires to electrodes of the semiconductor chips.

In the molding stage, the semiconductor chips mounted on the islands of the prior art lead-frame 1 are transferred to a transfer molding apparatus equipped with a transfer molding die 2 shown in FIG. 2. The transfer molding die 2 has an array of cavities 2a arranged in matrix, a pot 2b and runners 2c and 2d connecting the cavities 2a to the pot 2b. Though not shown in FIG. 2, a plunger is reciprocally moved in the pot 2b, and supplies synthetic resin from the pot 2b through the runners 2c and 2d to the cavities 2a. The array of the cavities 2a corresponds to the matrix of the lead-pad structures 1b, and the semiconductor chips mounted on the lead-frame 1 are placed into the cavities 2a.

The transfer molding die 2 is closed, and the semiconductor chips on the lead-frame 1 are accommodated in the cavities 2a. Molten resin is introduced into the pot 2b, and is pressurized by the plunger (not shown). The molten resin flows through the runners 2c and 2d into the cavities, and seals the semiconductor chips on the lead-frame therein.

After the solidification of the synthetic resin, the semiconductor devices, i.e., the semiconductor chips on the lead-frame sealed in the synthetic resin are taken out from the transfer molding die 2.

FIG. 3 illustrates another transfer molding die 3, and the second prior art transfer molding die 3 also has an array of cavities 3a, runners 3b and 3c and a pot 3d. The second prior art transfer molding die 3 differs from the first prior art transfer molding die 2 in the arrangement of the runners. Namely, the runners 2c serially connect the cavities 2a to the runner 2c. However, the runners 3c connect the runner 3b in parallel to the cavities 3a.

The prior art molding technology encounters a problem in low productivity, low production yield and high production cost. This is because of the fact that the molten resin 4 is branched from the runner 2c/3b through the runners 2d/3c into the cavities 2a/3a as shown in FIG. 4. The distance from the pot 2b/3d to the cavities 2a/3a is different depending upon the location of the cavities 2a/3a, and time lug takes place between the filling to the farthest cavity 2a/3a and the filling to the nearest cavity 2a/3a. Long time period is consumed until all the cavities 2a/3a are filled with the molten resin, and, accordingly, deteriorates the productivity.

Moreover, the transfer pressure is different between the farthest cavity 2a/3a and the nearest cavity 2a/3a, and non-filling tends to take place at the farthest cavity 2a/3a. This results in a low production yield.

The molten resin flows through the runners 2c/2d or 3b/3c to the cavities 2a/3a, and are solidified not only in the cavities 2a/3a but also on the vacant area assigned to the runners 2c/2d or 3b/3c and the pots 2b/3d. The synthetic resin solidified on the vacant area is useless and, accordingly, wasteful. For this reason, the prior art molding technology increases the production cost of the semiconductor device.

If the pot 5a is multiplied as shown in FIG. 5, each pot 5a is connected through a runner 5b and sub-runner 5c to cavities 5d, and the productivity may be improved. However, the transfer pressure is still different between the cavities 5d close to the pots 5a and the cavities 5d spaced from the pots 5a, and the non-filling still takes place in the cavities spaced from the pots 5a. The plurality of pots 5a and the runners 5b/5c still waste the synthetic resin, and increase the production cost of the semiconductor device.

Japanese Patent Publication of Unexamined Application No. 57-187945 discloses a lead-frame 6 shown in FIG. 6, and lead-pad structures 6a are arranged in more than two rows. Even if the lead-frame 6 is used, the productivity is slightly increased, and the prior art molding technology still suffers from the low production yield and high production cost.

Japanese Patent Publication of Unexamined Application No. 61-276333 discloses a molding die 7 shown in FIG. 7. The prior art molding die 7 has cavities 7a arranged on a circumference, and runners 7b radially extend from a pot 7c to the cavities 7a. The molten resin concurrently fills the cavities 7a. For this reason, the transfer speed is relatively high, and the non-filling hardly takes place.

However, the molten resin is supplied from the central pot 7c, and the cross section of the pot 7c is large. For this reason, a large amount of residual synthetic resin remains in the cull portion and the runners 7b, and the production cost is not reduced.

Moreover, the prior art molding die 7 requires an annular lead-frame 8 shown in FIG. 8. The annular lead-frame 8 includes an outer circular frame 8a, an inner circular frame 8b and a plurality of lead-pad structures 8c connected between the outer circular frame 8a and the inner circular frame 8b. The lead-pad structures 8c are sparsely arranged, and no lead-pad structure 8a occupies inside of the inner circular frame 8b. For this reason, the prior art molding die 7 is low in productivity and poor in compatibility.

SUMMARY OF THE INVENTION

It is therefore an important object of the present invention to provide a molding apparatus which achieves high productivity, high production yield and low production cost.

It is also an important object of the present invention to provide a lead-frame available for the molding apparatus.

To accomplish the object, the present invention proposes to supply molten resin through runner groups equally spaced from associated pots to associated cavity groups.

In accordance with one aspect of the present invention, there is provided a molding die having a major surface, comprising: a plurality of cavities open to the major surface for accommodating semiconductor chips mounted on a lead-frame, respectively, and arranged in rows and columns, the plurality of cavities being divided into a plurality of cavity groups each having cavities in two of the rows; a plurality of pots open to the major surface, and respectively associated with the plurality of cavity groups, each of the plurality of pots being equally spaced from the cavities of associated one of the plurality of cavity groups; and a plurality of runner groups open to the major surface, and respectively associated with the plurality of cavity groups and the plurality of pots, each of the plurality of runner groups having a plurality of straight runners connected between the cavities of associated one of the plurality of cavity groups and associated one of the plurality of pots so as to guide molten resin from the associated one of the plurality of pots to the cavities of the aforesaid associated one of the plurality of cavity groups.

In accordance with another aspect of the present invention, there is provided a lead-frame used for a molding die, the molding die having a plurality of cavities arranged in rows and columns, a plurality of pots for pressurizing molten resin and a plurality of straight runners for guiding the molten resin from the plurality of pots to the plurality of cavities, the lead-frame comprising a plurality of lead-pad structures arranged in rows and columns, each of the lead-pad structures having an island for mounting a semiconductor chip and leads electrically connected to electrodes of the semiconductor chip, and an interconnecting means for integrating the plurality of lead-pad structures together and having at least one tying member extending between two of the rows of lead-pad structures so as to be connected thereto, the at least one tying member having a plurality of areas each assigned to cavities in the two of the rows, one of the pots equally spaced from the cavities and straight runners connected between the aforesaid one of the pots and the cavities.

BRIEF DESCRIPTION OF THE DRAWINGS

The features and advantages of the molding apparatus and the lead-frame according to the present invention will be more clearly understood from the following description taken in conjunction with the accompanying drawings in which.

DESCRIPTION OF THE PREFERRED EMBODIMENTS

First Embodiment

Figure 9:
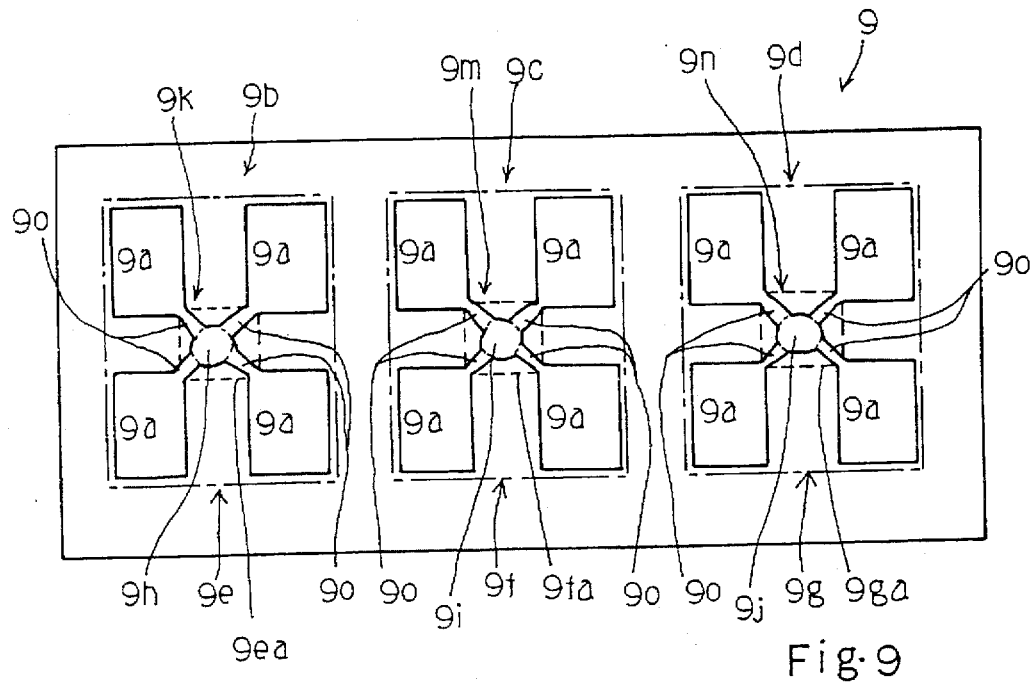
FIG. 9 is a plan view showing the inside of a molding die according to the present invention.

Referring to FIG. 9 of the drawings, a molding die 9 embodying the present invention has a plurality of cavities 9a arranged in rows and columns. Every four cavities 9a in the adjacent two rows form a plurality of cavity groups 9b, 9c and 9d, and the plurality of cavity groups 9b to 9d respectively occupy rectangular areas 9e, 9f and 9g. The four cavities 9a of each group are located at the four corners of the rectangular area 9e/9f/9g.

A plurality of pots 9h, 9i and 9j are formed over central sub-areas 9ea, 9fa and 9ga of the rectangular areas 9e, 9f and 9g, and plungers (not shown) are reciprocally moved in the pots 9h to 9i. A plurality of runner groups 9k, 9m and 9n radially extend over the central sub-areas 9ea to 9ga, and are straightly connected from the pots 9h to 9j to the cavity groups 9b to 9d, respectively. Namely, the runner group 9k is, by way of example, implemented by four runners 9o radially extending from the pot 9h to the four cavities 9a, and the distance from the pot 9h to one of the four cavities 9a is equal to the distances to the other cavities 9a. Thus, the distance is minimized. The other runner groups 9m and 9n are similarly arranged to the runner group 9k.

Each of the pots 9h to 9j is expected to supply molten resin to the associated four cavities 9a only, and the plunger displacement is much smaller than that of the prior art transfer molding die. For this reason, the cross section of the pot 9h/9i/9j is relatively small.

The short runners 9o and the thin pots 9h to 9j make the total central sub-areas 9ea/9fa/9ga much narrower than not only the area assigned to the single pot 2b/3d and the runners 2c+2d/3b+3c but also the multiple pots 5a and the runners 5b+5c. This results in that the molding die 9 is small in volume.

The thin pots 9h and 9j and the short runners 9o decrease the culls and the other residual resin in the runners 9o, and the molding die 9 reduces the production cost of the semiconductor device.

Figure 10:
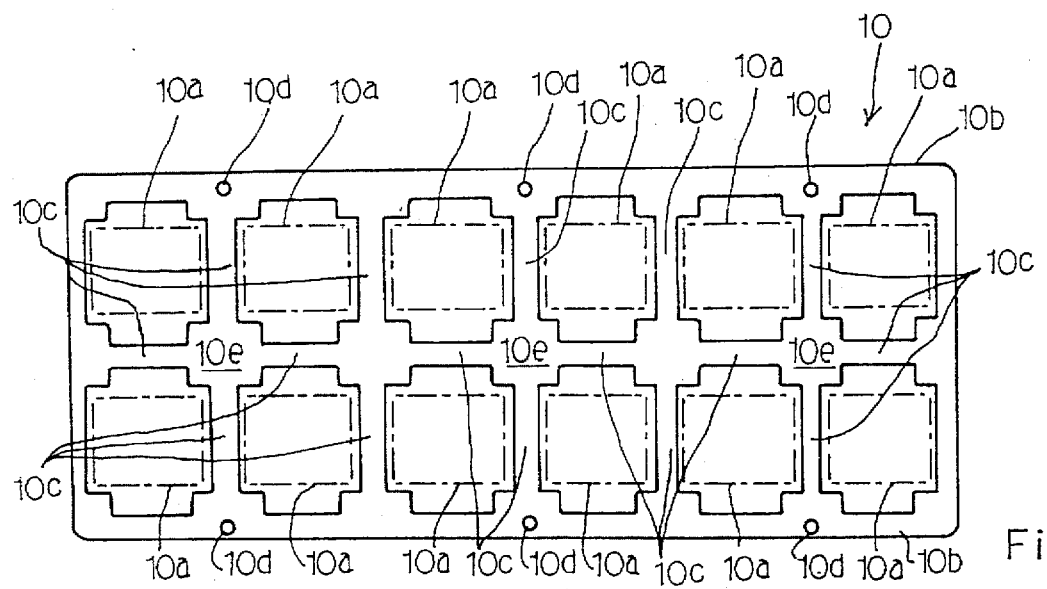
FIG. 10 is a plan view showing the layout of a lead-frame available for the molding die.
Figure 11:
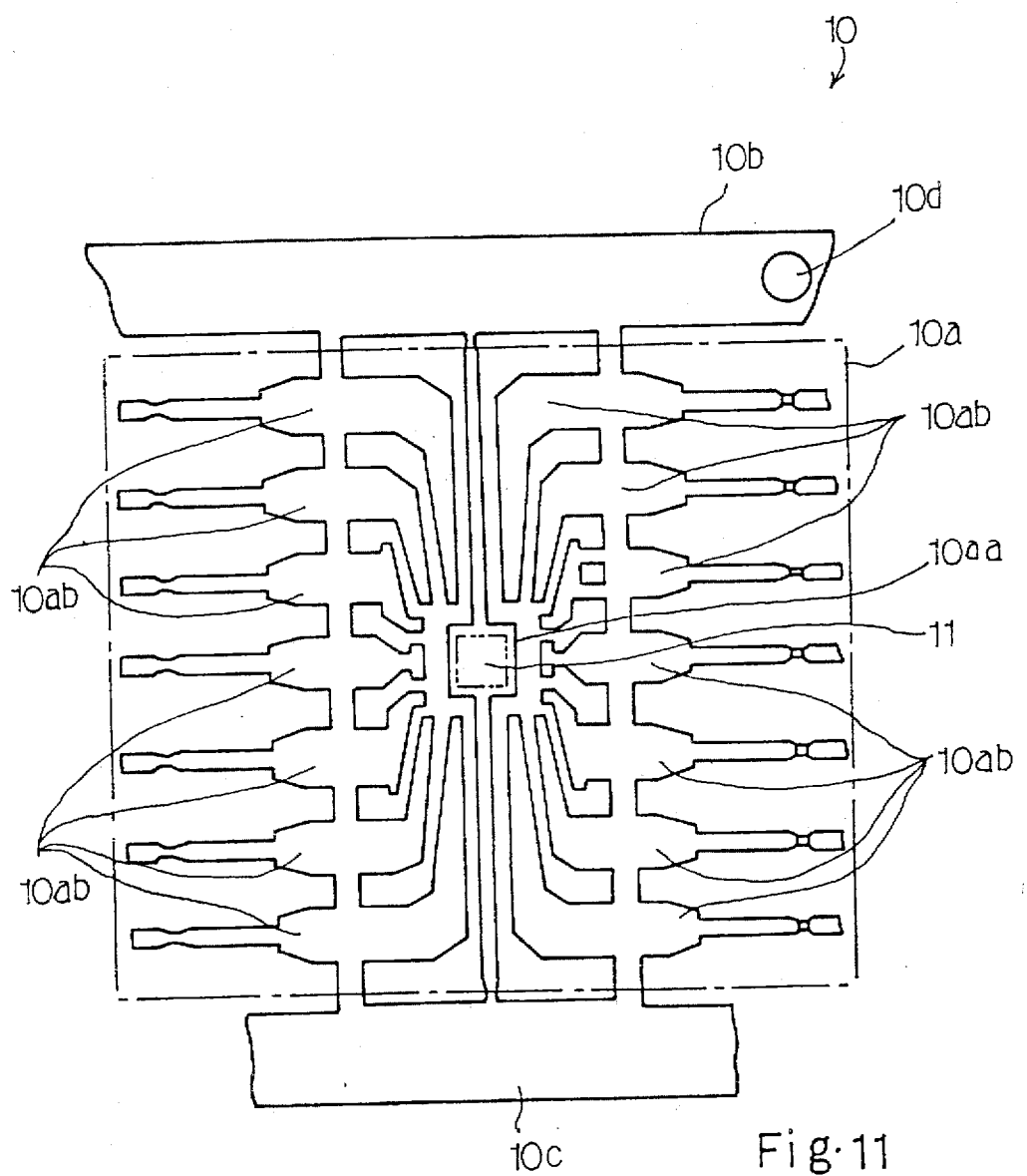
FIG. 11 is a plan view showing an island and leads incorporated in the lead-frame.

FIG. 10 illustrates a lead-frame 10 available for the molding die 9. The lead-frame 10 includes a plurality of lead-pad structures 10a arranged in rows and columns, and the arrangement of the lead-pad structures 10a is corresponding to the arrangement of the cavities 9a. Therefore, when the lead-frame 10 is correctly accommodated in the transfer molding die 9, the lead-pad structures 10a are placed in the cavities 9a, respectively. The lead-pad structure 10a has an island 10aa for mounting a semiconductor chip 11 and leads 10ab connectable to electrodes on the semiconductor chip 11 by means of bonding wires (not shown) as shown in FIG. 11.

Turning back to FIG. 10, the lead-frame 10 further includes a frame 10b and tie bars 10c for supporting the lead-pad structures, and alignment holes 10d are formed in the frame 10b. The twelve lead-pad structures 10a are arranged in two rows, and the tie bar 10c between the two rows is partially increased in width so as to form wide areas at intervals. Every second wide area 10e is corresponding to the central sub-area 9ea/9fa/9ga assigned to the pot 9h and the runners 9o radially extending therefrom. The wide area 10e is approximately equal to the associated central sub-area 9ea/9fa/9ga. The wide area 10e is only slightly wider than the wide portion of the tie bar 1c of the prior art lead-frame 1, and the narrow additional area cancels the wide vacant area assigned to the pot 2b and the runner 2c. For this reason, the lead-pad structures 10a are packed in the frame 10b at higher density than the prior art lead-frame 1.

The lead-frame 10 is advantageous over the prior art annular lead-frame 8. In detail, the wide inner vacant area is indispensable for the prior art annular lead-frame 8, because the thick pot 7c occupies there. This means that only the annular outer area is available for the lead-pad structure 8c, and the prior art lead-pad structures 8c are packed between the inner circular frame 8b and the outer circular frame 8a at a low density. On the other hand, the wide area 10e is not only occupied by the pot 9h to 9j and the runners 9o but also serves as the tie bar. As will be understood from the comparison with the prior art lead-frame 1, the tie bar 1c is indispensable for a lead-frame, and the present inventors modifies the tie bar in such a manner as to be overlapped with the central sub-areas 9ea/9fa/9ga. The additional area to the tie bar is much smaller than the internal vacant area of the prior art annular lead-frame 8, and the lead-frame 10 of the present invention packs the lead-pad structures 10a at higher density than the prior art annular lead-frame 8.

Figure 12:
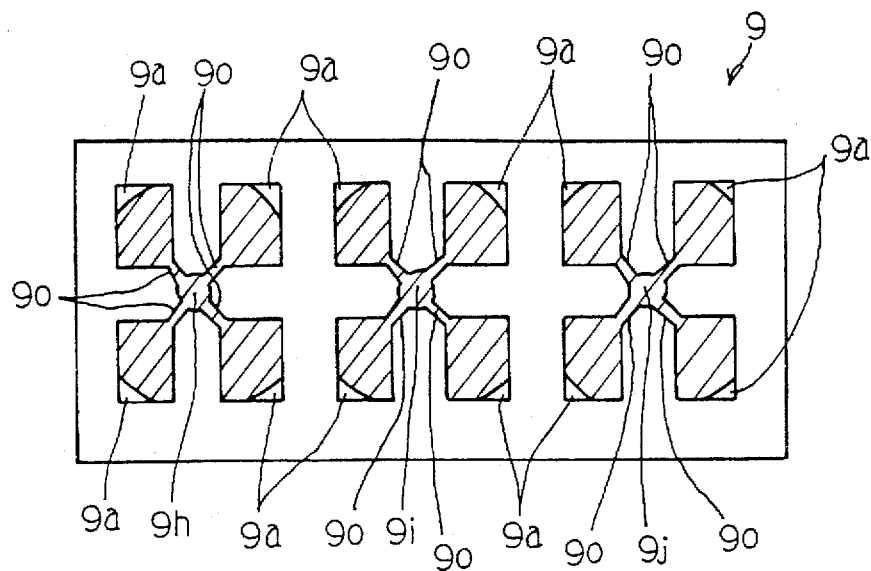
FIG. 12 is a plan view showing the molten resin spread through runners formed in the molding die shown in FIG. 9.

In an assembling process, the semiconductor chips 11 are mounted on and bonded to the islands 10aa, and bonding wires (not shown) electrically connect the electrodes on the semiconductor chips 11 to the leads 11ab. The lead-frame 10 is conveyed to the molding die 9, and is accommodated in the molding die 9. Namely, the lead-pad structures 10a are placed in the cavities 9a, respectively, and the molding die 9 is closed. Molten resin is supplied to the pots 9h to 9j, and the plungers (not shown) pressurize the molten resin in the pots 9h to 9j. The molten resin flows through the runners 9o, and concurrently fills the cavities 9a. As described hereinbefore, the cavities 9a are equally spaced from the pots 9h/9i/9j, and the molten resin, which is hatched in FIG. 12 for easy discrimination, is spread over the runners 9o, and concurrently reaches the cavities 9a. Thus, time lug does not take place in the filling stage, and the transfer speed is improved. Moreover, the radially extending runners 9o equally provide friction against the molten resin flow, and the molten resin is evenly pressurized in the cavities 9a. For this reason, no-filling hardly takes place, and the molding die 9 improves the production yield of the semiconductor device.

After the solidification of the synthetic resin, the lead-frame 10 is taken out form the molding die 9, and the semiconductor devices are separated from one another. The culls and the residual resin are so small that the production cost is decreased.

In this instance, the tie bars 10c with the wide areas 10e form in combination a tying member, and the frame 10b and the tie bars 10c as a whole constitute an interconnecting means.

Second Embodiment

Figure 13:
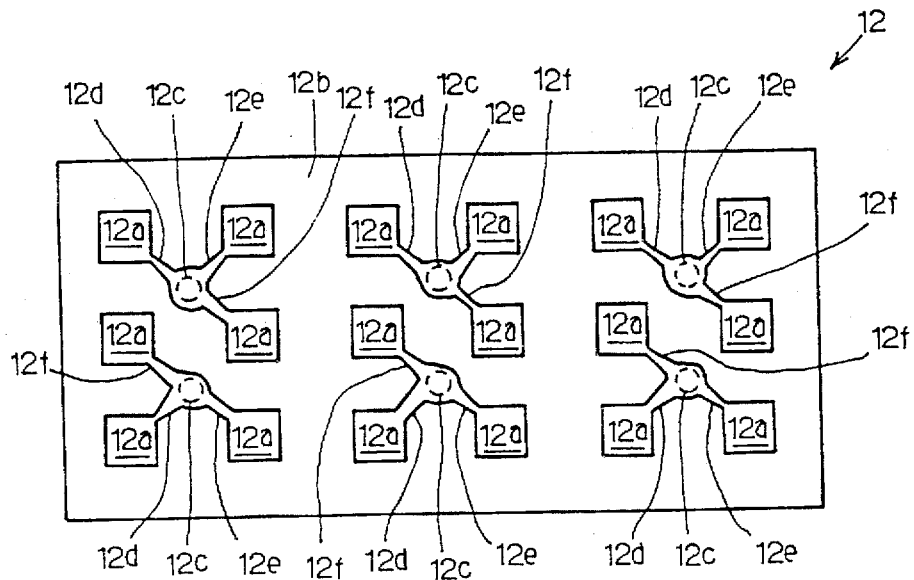
FIG. 13 is a plan view showing the inside of a molding die according to the present invention.

FIG. 13 illustrates another molding die 12 embodying the present invention. A plurality of cavities 12a are open to the inner surface 12b of the molding die 12, and are arranged in rows and columns. Every two cavities in the first and third rows form a cavity group together with one of the cavities 12a in the second row, and pots 12c are provided for the cavity groups, respectively. Though not shown in FIG. 13, plungers are inserted in the pots 12c, and are reciprocally movable in the associated pots 12c. Each of the pots 12c is equally spaced from the cavities of the associated cavity group.

A plurality of runner groups are further associated with the cavity groups, respectively, and each of the runner groups contains three runners 12d, 12e and 12f. The runners 12d and 12e connect the associated pot 12c to the cavities 12a in the same row, and the runner 12f is connected between the associated pot 12c and the cavity 12a in the different row. The runners 12d, 12e and 12f straightly extend, and are equal in length to one another.

Figure 14:
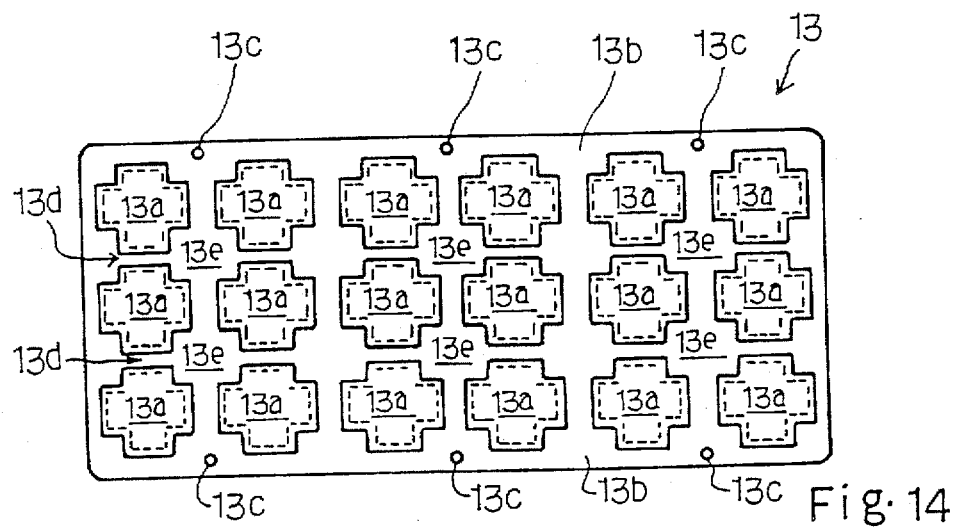
FIG. 14 is a plan view showing the layout of another lead-frame according to the present invention.

Turning to FIG. 14 of the drawings, a lead-frame 13 embodying the present invention largely comprises lead-pad structures 13a arranged in rows and columns. In this instance, three rows and six columns are incorporated in the array of the lead-pad structures 13a, and is available for a plastic molding using the die 12.

The lead-frame 13 further comprises a frame 13b formed with alignment holes 13c and tie bars 13d, and the frame 13b and the tie bars 13d are connected to the lead-pad structures 13a so as to support them. The tie bar 13d is partially increased in width, and, accordingly, form wide areas 13e.

Each of the wide areas 13e is assigned to one of the pots 12c and the associated runner group 12d/12e/12f. Namely, when the lead-frame 13 is confined in the molding die 12, the lead-pad structures 13a are placed in the cavities 12a, respectively, and the pots 12c and the runner groups 12d/12e/12f occupy the wide areas 13e.

Figure 15:
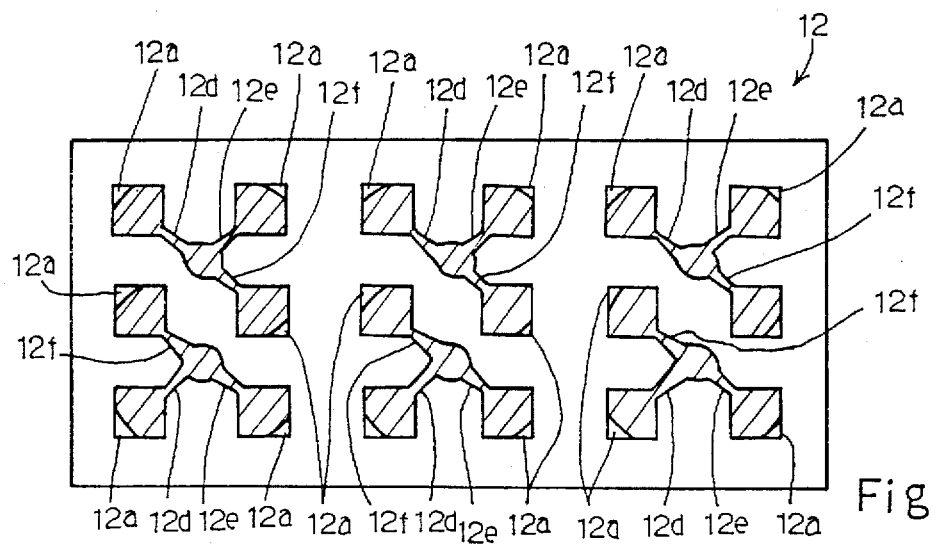
FIG. 15 is a plan view showing molten resin spread through runners formed in the molding die shown in FIG. 14.

Molten resin, which is hatched in FIG. 15, is evenly spread from the pots 12c through the runners 12d/12e/12f, and concurrently reaches the associated cavities 12a as similar to the molten resin in the die 9. The lead-frame 13 and the molding die 12 achieve all of the advantages of the first embodiment.

Third Embodiment

Figure 1:
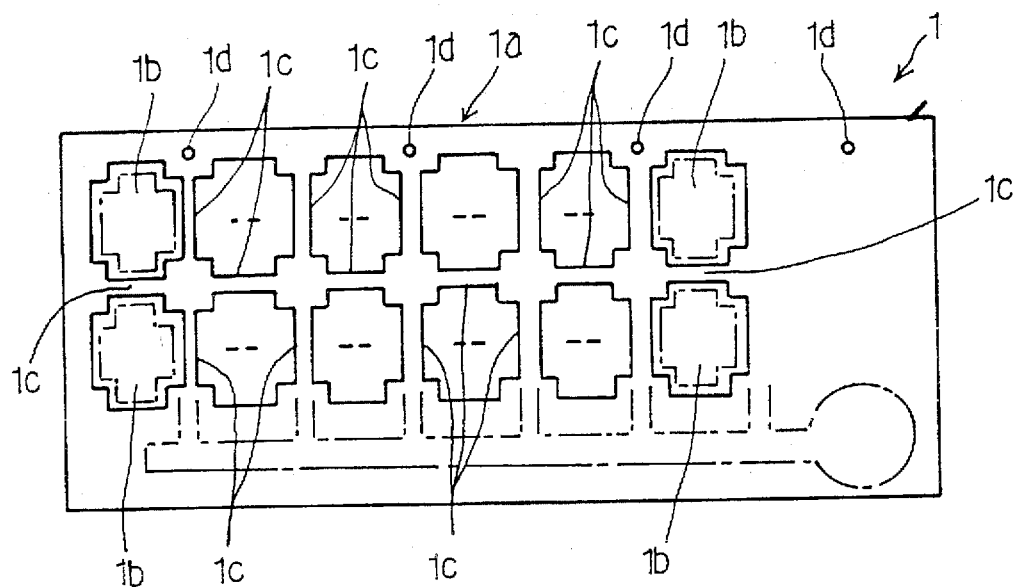
FIG. 1 is a plan view showing the prior art lead-frame.
Figure 2:
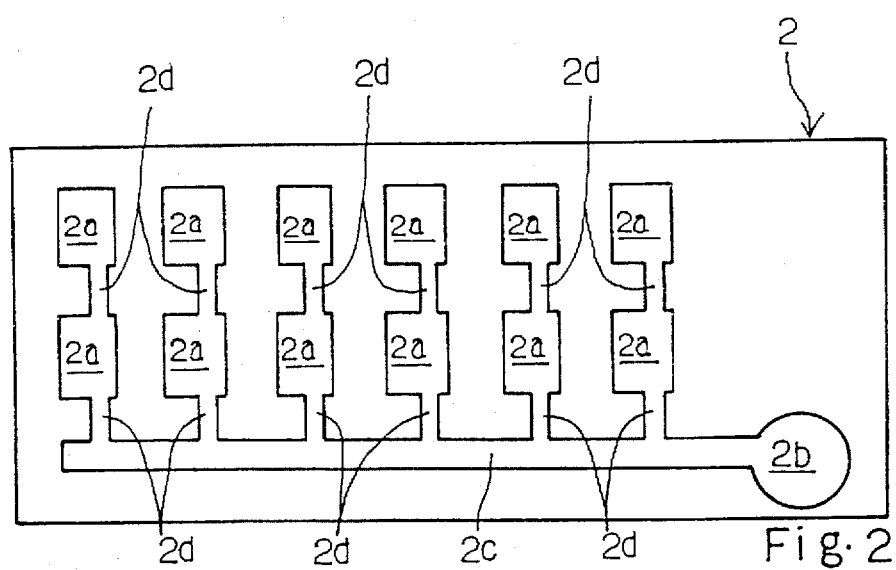
FIG. 2 is a plan view showing the inside of the transfer molding die incorporated in the prior art transfer molding apparatus.
Figure 3:
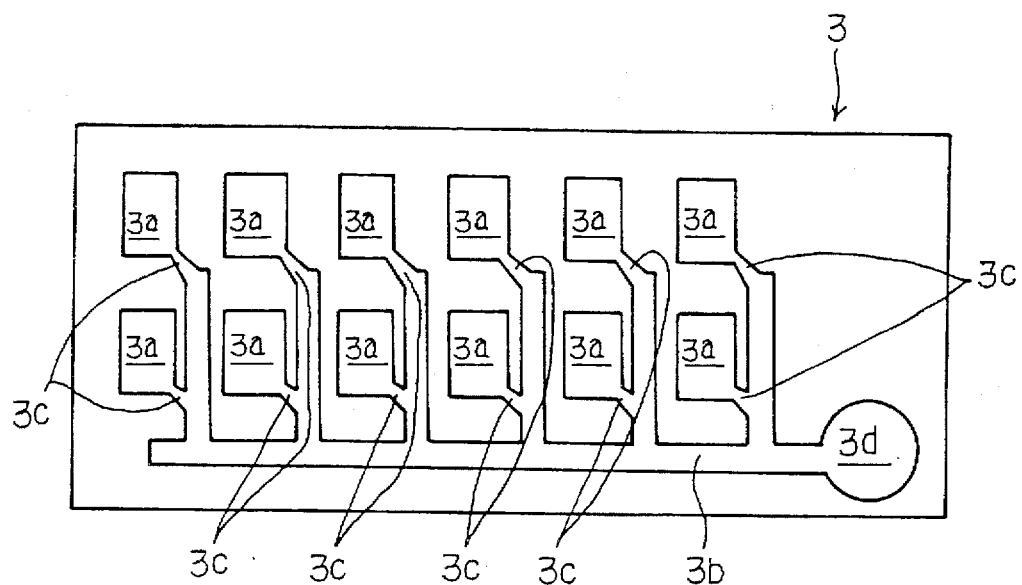
FIG. 3 is a plan view showing the inside of another prior art transfer molding die.
Figure 4:
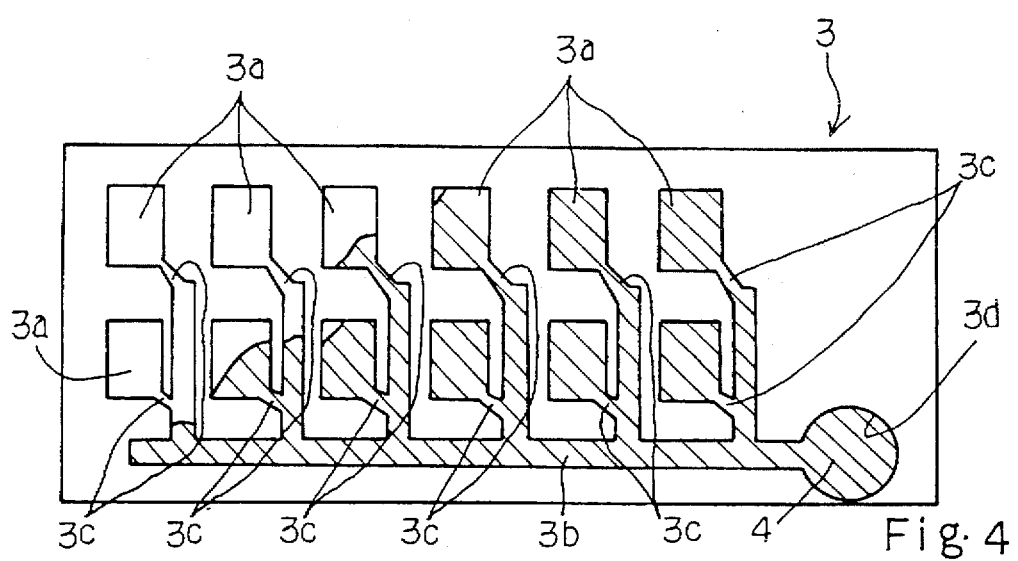
FIG. 4 is a plan view showing the flow of molten resin in the prior art transfer molding die.
Figure 5:
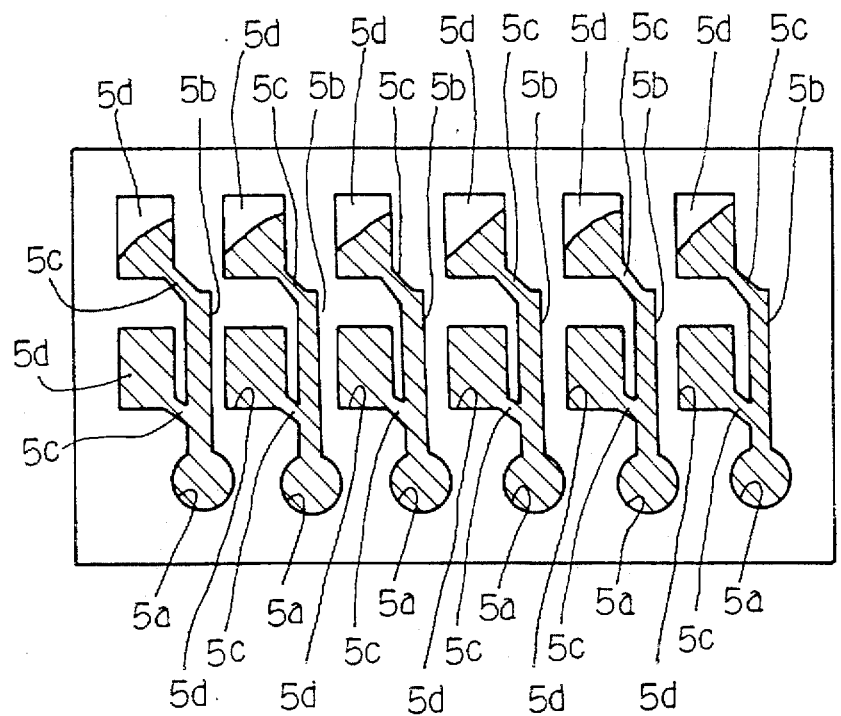
FIG. 5 is a plan view showing the inside of the prior art multiple transfer molding die.
Figure 6:
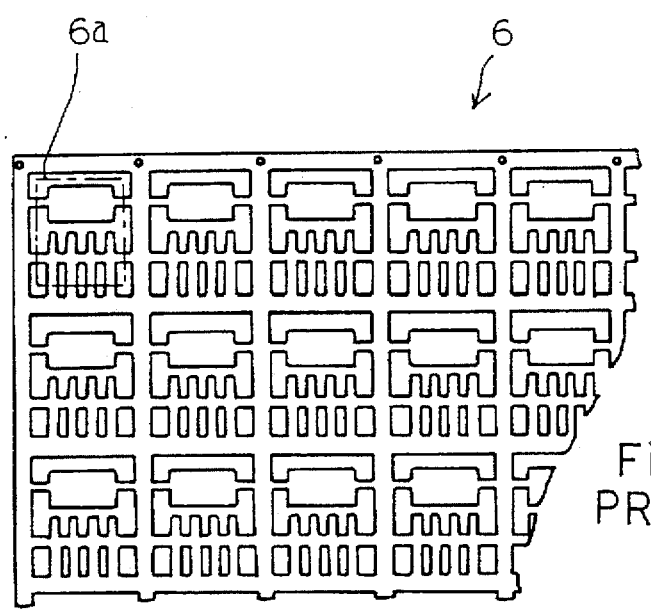
FIG. 6 is a plan view showing the prior art lead-frame disclosed in Japanese Patent Publication of Unexamined Application No. 57-187945.
Figure 7:
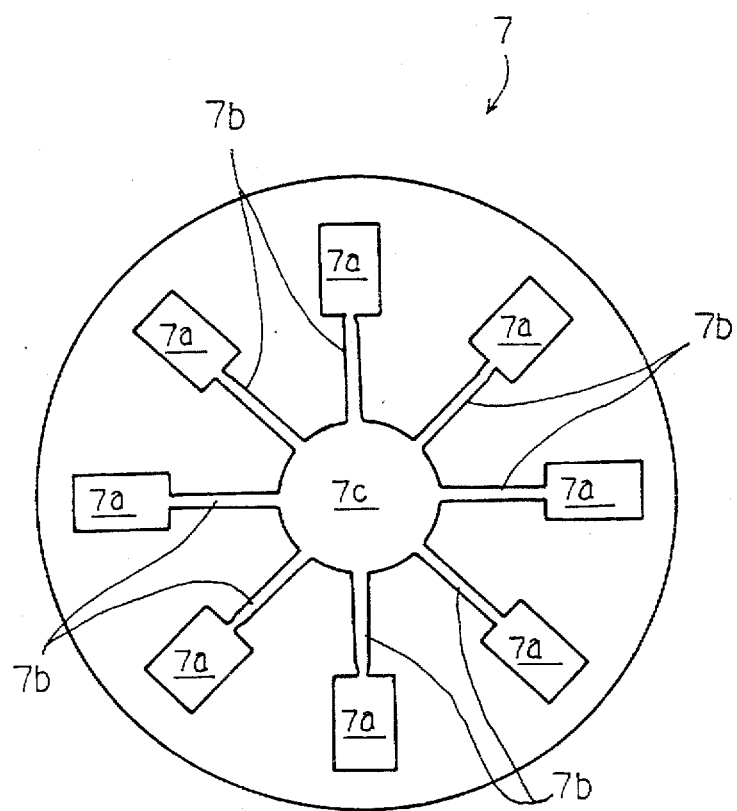
FIG. 7 is a plan view showing the prior art molding die disclosed in Japanese Patent Publication of Unexamined Application No. 61-276333.
Figure 8:
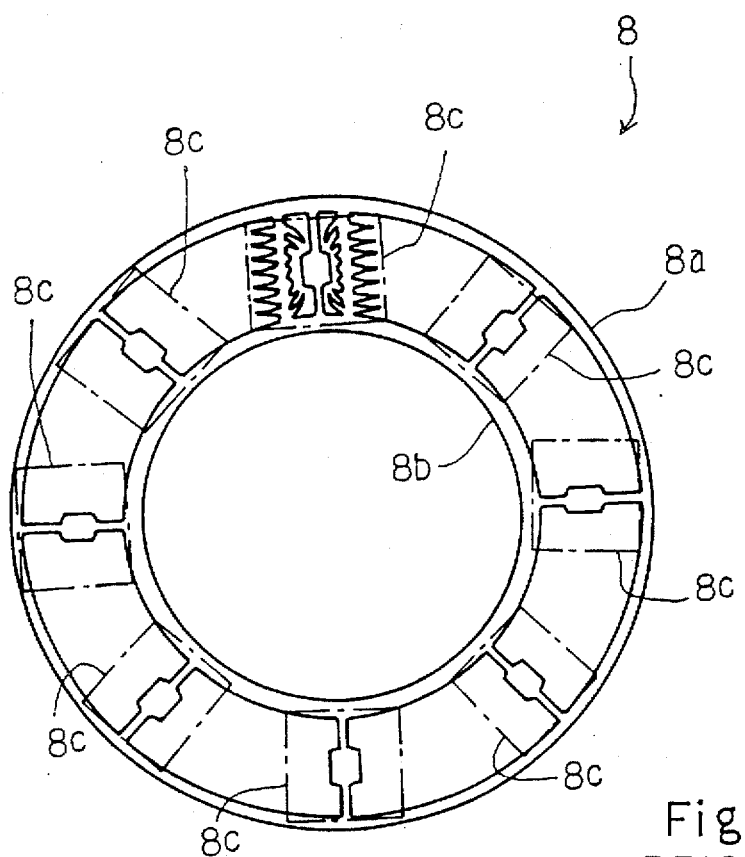
FIG. 8 is a plan view showing the prior art annular lead-frame.
Figure 16:
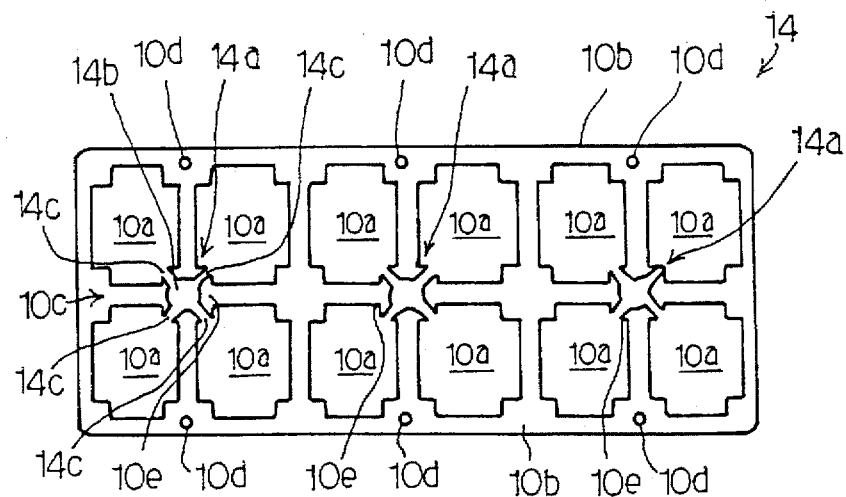
FIG. 16 is a plan view showing the layout of yet another lead-frame according to the present invention.

FIG. 16 illustrates a lead-frame 14 embodying the present invention. The lead-frame 14 is analogous to the lead-frame 10 except for hollow spaces 14a, and the other parts of the lead-frame 14 are labeled with the same references designating the corresponding parts of the first embodiment without detailed description.

The hollow spaces 14a are formed in the wide areas 10e, respectively, and a through-hole 14b and slits 14c extending from the through-hole 14b form in combination each of the hollow space 14a. The through-hole 14b and the slits 14c are corresponding to the pout 9h/9i/9j and the runners 9o, respectively, and the hollow spaces 14a make the removal of the cull and the residual synthetic resin from the wide areas 10e easy.

The lead-frame 14 is available for the molding die 9, and achieves all of the advantages of the first embodiment.

Fourth Embodiment

Figure 17:
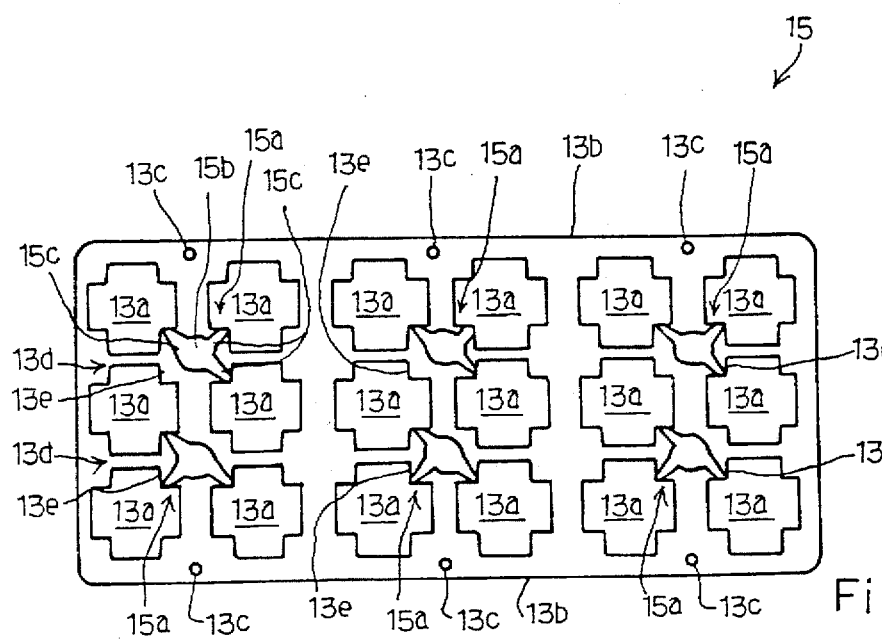
FIG. 17 is a plan view showing the layout of still another lead-frame according to the present invention.

FIG. 17 illustrates a lead-frame 15 embodying the present invention. The lead-frame 15 is analogous to the lead-frame 13 except for hollow spaces 15a, and the other parts of the lead-frame 15 are labeled with the same references designating the corresponding parts of the second embodiment without detailed description.

The hollow spaces 15a are formed in the wide areas 13e, respectively, and a through-hole 15b and slits 15c extending from the through-hole 15b form in combination each of the hollow space 15a. The through-hole 15b and the slits 15c are corresponding to the pot 12c and the runners 12d/12e/12f, respectively, and the hollow spaces 15a make the removal of the cull and the residual synthetic resin from the wide areas 13e easy.

The lead-frame 15 is available for the molding die 12, and achieves all of the advantages of the second embodiment.

As will be appreciated from the foregoing description, the pot and the associated runners are assigned to the wide area of the tie bar, and the straight runners equal in length minimize the additional area added to the wide portion of the prior art tie bar. For this reason, molten resin concurrently reaches the cavities, and the molding die and the lead-frame improves the productivity, the production yield and the production cost.

Although particular embodiments of the present invention have been shown and described, it will be obvious to those skilled in the art that various changes and modifications may be made without departing from the spirit and scope of the present invention.

For example, the rows of cavities/lead-pad structures may be more than three. If the rows of cavities/lead-pad structures are an even number, the layout shown in FIGS. 9 and 10 are repeated. On the other hand, if the rows of cavities/lead-pad structures are an odd number, the layout shown in FIGS. 9 and 10 is combined with the layout shown in FIGS. 13 and 14.

The present invention is applicable to an injection type molding die and a lead-frame used therein.

What is claimed is:

1. A molding die having a major surface, comprising:

a plurality of cavities open to said major surface for accommodating semiconductor chips mounted on a lead frame, respectively, and arranged in rows and columns, said plurality of cavities being divided into a plurality of cavity groups each having cavities in two of said rows, said rows of cavities being an odd number, and each of said cavity groups including two cavities selected from one of said two rows and one cavity selected from the next row;

a plurality of pots open to said major surface, and respectively associated with said plurality of cavity groups, each of said plurality of pots being equally spaced from said cavities of an associated one of said plurality of cavity groups; and a plurality of runner groups open to said major surface, and respectively associated with said plurality of cavity groups and said plurality of pots, each of said plurality of runner groups having a plurality of straight runners connecting said cavities of an associated one of said plurality of cavity groups and an associated one of said plurality of pots so as to guide molten resin from said associated one of said plurality of pots to said cavities of said associated one of said plurality of cavity groups.

* * * * *